(12) United States Patent
Yoshimizu et al.

(10) Patent No.: US 9,980,407 B2
(45) Date of Patent: May 22, 2018

(54) ELECTRONIC DEVICE, AND ELECTRONIC STRUCTURE PROVIDED WITH ELECTRONIC DEVICE

(71) Applicant: DENSO CORPORATION, Kariya, Aichi-pref. (JP)

(72) Inventors: Takashi Yoshimizu, Kariya (JP); Yuuki Sanada, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/507,364

(22) PCT Filed: Sep. 17, 2015

(86) PCT No.: PCT/JP2015/004756
§ 371 (c)(1),
(2) Date: Feb. 28, 2017

(87) PCT Pub. No.: WO2016/047116
PCT Pub. Date: Mar. 31, 2016

(65) Prior Publication Data
US 2017/0290187 A1    Oct. 5, 2017

(30) Foreign Application Priority Data
Sep. 22, 2014  (JP) .................................. 2014-192745

(51) Int. Cl.
*H05K 7/20* (2006.01)
*H05K 7/14* (2006.01)
(Continued)

(52) U.S. Cl.
CPC .......... *H05K 7/1427* (2013.01); *H01G 2/065* (2013.01); *H01G 2/08* (2013.01); *H01G 2/103* (2013.01);
(Continued)

(58) Field of Classification Search
CPC . G06F 1/181–1/182; H05K 7/20218–7/20381;
(Continued)

(56) References Cited

U.S. PATENT DOCUMENTS 5,633,783 A * 5/1997 Yamamoto .......... H01L 23/5385
257/686
6,379,997 B1 * 4/2002 Kawahara ........... H01L 21/4853
257/668
(Continued)

FOREIGN PATENT DOCUMENTS

JP    2003-283093 A    10/2003
JP    2005-286209 A    10/2005
(Continued)

*Primary Examiner* — Anthony Haughton
*Assistant Examiner* — Razmeen Gafur
(74) *Attorney, Agent, or Firm* — Posz Law Group, PLC

(57) ABSTRACT

An electronic device includes a circuit board with an insulating substrate, a wiring at the substrate, an electronic component mounted at the substrate and electrically connected to the wiring, at least one through hole through the substrate from one surface to an opposite surface of the one surface of the substrate, and a conductive member arranged at a surface of the through hole and electrically connected to the wiring; and further includes: a sealing resin; and a cap including an annular connection with a part connected to the substrate and a recess recessed from the annular connection. Furthermore, in the cap, at least a part of the connection is connected to the substrate, the cap being sealed integrally with the electronic component by the sealing resin while arranging a space communicating with the through hole; and a terminal is inserted into the through hole and electrically connected to the wiring.

23 Claims, 12 Drawing Sheets

(51) Int. Cl.
| | |
|---|---|
| *H01L 23/498* | (2006.01) |
| *H01L 23/31* | (2006.01) |
| *H01L 23/053* | (2006.01) |
| *H05K 1/18* | (2006.01) |
| *H01L 23/10* | (2006.01) |
| *H01G 2/06* | (2006.01) |
| *H01G 2/10* | (2006.01) |
| *H05K 1/11* | (2006.01) |
| *H01L 23/367* | (2006.01) |
| *H01G 2/08* | (2006.01) |
| *H05K 1/02* | (2006.01) |
| *H01L 23/473* | (2006.01) |

(52) U.S. Cl.
CPC ............ *H01L 23/053* (2013.01); *H01L 23/10* (2013.01); *H01L 23/3121* (2013.01); *H01L 23/3675* (2013.01); *H01L 23/49827* (2013.01); *H01L 23/49844* (2013.01); *H05K 1/0203* (2013.01); *H05K 1/115* (2013.01); *H05K 1/181* (2013.01); *H05K 2201/10015* (2013.01); *H05K 2201/10166* (2013.01)

(58) Field of Classification Search
CPC ........................ H05K 7/20409–7/20418; H05K 7/20009–7/202; H05K 5/00–5/069; H05K 7/00–7/186; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | |
|---|---|---|---|
| 7,294,007 B1 | 11/2007 | Lawlyes | |
| 2004/0089943 A1* | 5/2004 | Kirigaya | H01L 23/49811 257/723 |
| 2006/0209139 A1* | 9/2006 | Murata | B41J 2/14233 347/71 |
| 2007/0041162 A1* | 2/2007 | Sedio | H05K 1/181 361/714 |
| 2007/0096295 A1* | 5/2007 | Burtzlaff | B81C 1/00293 257/704 |
| 2008/0002460 A1* | 1/2008 | Tuckerman | B81C 1/00301 365/158 |
| 2008/0073768 A1* | 3/2008 | Shiraishi | B81B 7/007 257/684 |
| 2008/0116566 A1* | 5/2008 | Murayama | B81C 1/00301 257/700 |
| 2008/0137270 A1* | 6/2008 | Higashi | B81B 7/007 361/679.01 |
| 2009/0057006 A1* | 3/2009 | Kishibata | H05K 3/284 174/521 |
| 2009/0068795 A1* | 3/2009 | Higashi | B81B 7/007 438/121 |
| 2010/0117219 A1 | 5/2010 | Oka et al. | |
| 2011/0175235 A1* | 7/2011 | Horiuchi | H01L 23/49811 257/774 |
| 2011/0242476 A1* | 10/2011 | Moriwaki | G02F 1/13394 349/153 |
| 2012/0013021 A1* | 1/2012 | Kobayashi | H01L 23/49827 257/774 |
| 2012/0098138 A1 | 4/2012 | Oka et al. | |
| 2012/0275128 A1* | 11/2012 | Takada | H05K 1/0212 361/760 |
| 2012/0313203 A1* | 12/2012 | Fuse | H01L 27/14618 257/432 |
| 2013/0170233 A1* | 7/2013 | Nezu | H01R 33/465 362/368 |
| 2014/0216801 A1* | 8/2014 | Matsumoto | H05K 1/188 174/259 |
| 2014/0376189 A1* | 12/2014 | Sakaguchi | H01L 23/473 361/719 |
| 2015/0098189 A1* | 4/2015 | Sedio | H05K 1/181 361/690 |
| 2016/0105980 A1* | 4/2016 | Mori | H01L 23/10 361/728 |
| 2016/0183405 A1 | 6/2016 | Sanada et al. | |

FOREIGN PATENT DOCUMENTS

| | | |
|---|---|---|
| JP | 2009-289447 A | 12/2009 |
| JP | 2012-028487 A | 2/2012 |

\* cited by examiner

ELECTRONIC DEVICE, AND ELECTRONIC STRUCTURE PROVIDED WITH ELECTRONIC DEVICE

CROSS REFERENCE TO RELATED APPLICATIONS

This application is a U.S. national stage of International Patent Application No. PCT/JP2015/004756 filed on Sep. 17, 2015 and is based on Japanese Patent Application No. 2014-192745 filed on Sep. 22, 2014, the disclosures of which are incorporated herein by reference.

TECHNICAL FIELD

The present disclosure relates to an electronic device including a circuit board provided with a through hole into which a terminal is inserted, and an electronic structure including the electronic device.

BACKGROUND ART

A technique for inserting a terminal into a through hole that is provided through a circuit board has been available as disclosed in Patent Literature 1.

Although not a conventional technique, there is an electronic device in which an electronic component is mounted at the circuit board and sealed with a sealing resin. When a tip of a terminal is exposed from the through hole of such an electronic device, the terminal and a peripheral member can unintentionally establish an electrical connection. In order to electrically insulate the terminal from the peripheral member, the sealing resin can be arranged to reach a region facing the through hole in the electronic device. Note that the peripheral member in this case has a different potential member which has a potential different from that of the terminal.

However, the electronic device needs to be adapted such that the sealing resin does not get into the through hole. In order to prevent the sealing resin from getting into the through hole, the sealing resin can be arranged by using a mold in which a protrusion corresponding to the through hole is arranged, for example. That is, according to this manufacturing method, the sealing resin is arranged while inserting the protrusion of the mold into the through hole to fill the through hole.

In the electronic device manufactured by the aforementioned method, however, the position of the through hole is confined to the position of the protrusion in the mold. The position of the protrusion needs to be changed by machining the mold in order to change the position of the through hole. Such an electronic device therefore has a low degree of flexibility in terms of the position of the through hole.

PRIOR ART LITERATURES

Patent Literature

Patent Literature 1: JP 2005-286209 A

SUMMARY OF INVENTION

It is an object of the present disclosure to provide an electronic device which can have an increased degree of flexibility in terms of the position of a through hole while ensuring insulation of a terminal inserted into the through hole, and provides an electronic structure including the electronic device.

According to a first aspect of the present disclosure, an electronic device includes a circuit board including: an insulating substrate, a wiring arranged at the substrate, an electronic component mounted at the substrate and electrically connected to the wiring, at least one through hole which is arranged through the substrate from one surface of the substrate to an opposite surface of the one surface of the substrate, and a conductive member arranged at a surface of the through hole and electrically connected to the wiring, and the electronic device further includes: a sealing resin that seals the electronic component; and a cap that is mounted at the substrate, and that includes an annular connection including a part connected to the substrate and recessed from the annular connection. Moreover, the cap is configured such that at least a part of the connection is connected to the substrate to arrange a space communicating with the through hole with the recess facing one of an open end of the one surface of the substrate and an open end of the opposite surface of the one surface of the substrate of the through hole, the cap being sealed integrally with the electronic component by the sealing resin; and a terminal is inserted into the through hole and electrically connected to the wiring.

The electronic device is thus configured such that a tip of the terminal inserted into the through hole is covered with the cap and the sealing resin even when the tip of the terminal is exposed from the through hole. In other words, even when exposed from the through hole, the tip of the terminal in the electronic device is merely arranged in space communicating with the through hole and is not exposed to the outside of the sealing resin. The electronic device can therefore ensure insulation between the terminal and the different potential member when the terminal is inserted into the through hole.

The cap is placed over the through hole of the electronic device. The electronic device can thus prevent the sealing resin from getting into the through hole when the sealing resin is provided. The electronic device using the cap to prevent the sealing resin from getting into the through hole need only change the position of the cap in accordance with the position of the through hole when the sealing resin is provided to a substrate with the through hole arranged at a different position. Therefore, a mold need not be machined when the electronic device is provided with the sealing resin to the substrate with the through hole arranged at the different position. The electronic device can thus have an increased degree of flexibility in terms of the position of the through hole.

According to a second aspect of the present disclosure, an electronic structure includes: the above-mentioned electronic device; the terminal; and a housing member that arranges a housing space to house the electronic device and houses the electronic device in the housing space. Furthermore, the housing member includes: a first member which is made of metal, includes a part facing a surface at which the cap is mounted of the substrate, and is in contact with the electronic device; and a second member which is joined to the first member to form the housing space, includes a part facing a surface, at which the cap is not mounted, of the substrate, and has the terminal protruded into the housing space.

The electronic structure forms the housing space with the first member and the second member to house the electronic device in the housing space. The electronic structure can thus prevent a foreign matter from adhering to the electronic device. Moreover, the first member made of metal is in contact with the electronic device in the electronic structure. The electronic structure can thus dissipate heat through the first member even when heat is generated from the electronic device. The electronic device can also ensure insulation between the terminal and the different potential member, as described above. The electronic structure can thus ensure insulation between the terminal and the first member even when the first member is made of metal and includes the part facing the surface of the substrate at which the cap is mounted.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
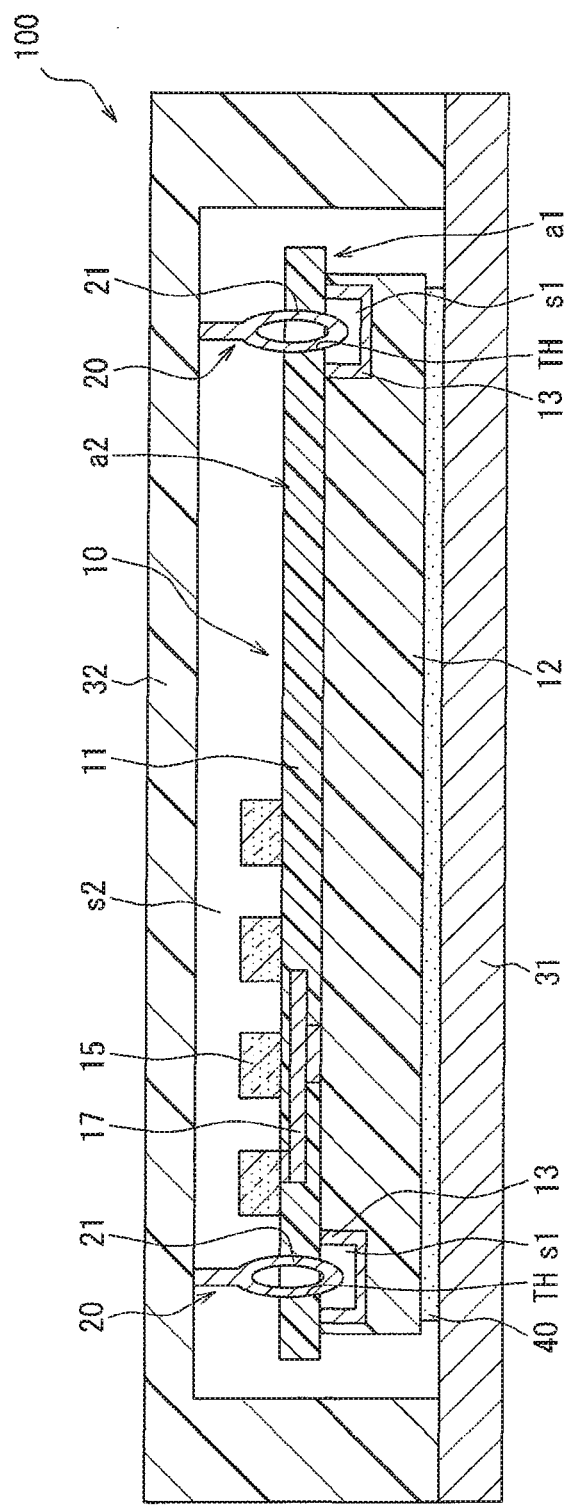
FIG. 1 is a cross-sectional view illustrating a schematic structure of an electronic structure according to an embodiment.

A plurality of embodiments for carrying out the invention will now be described with reference to the drawings. In each embodiment, a part corresponding to a matter described in a preceding embodiment will be assigned a reference numeral identical to that assigned in the preceding embodiment to omit a redundant description in some cases. When only a part of the configuration is described in each embodiment, the description in a preceding embodiment can be referenced and applied to the other parts of the configuration.

As illustrated in FIG. 1, an electronic structure 100 includes an electronic device 10, a terminal 20, and a first member 31 and a second member 32 that form a housing space housing the electronic device 10. The electronic device 10 includes a substrate 11, a molding resin 12, a cap 13, an electronic component 14, and the like. Note that the electronic device 10 will be described in detail later.

The terminal 20, the first member 31, and the second member 32 will be described first. The terminal 20 is a part of a connector of an external device provided outside the electronic device 10. A press-fit terminal having a deformable portion 21 is employed as the terminal 20, for example. In other words, a so-called press-fit terminal is employed as the terminal 20. The deformable portion 21 of the terminal 20 is deformed when the terminal is inserted into a through hole TH provided in the electronic device 10 to be described.

The deformable portion 21 is a part that stays within the through hole TH when the terminal 20 is inserted into the through hole TH. The deformable portion 21 is ring-shaped as illustrated in FIG. 1, for example. The terminal 20 is arranged such that, when inserted into the through hole TH, the deformable portion 21 of the terminal undergoes a deformation. That is, the deformable portion 21 inserted into the through hole TH receives stress from a conductive member 18 provided at the surface of the through hole TH. It can thus be said that the terminal 20 is press-fitted into the through hole TH. It can also be said that the terminal 20 is in contact with the conductive member 18 by a reaction force of the deformable portion 21. The terminal 20 is press-fitted into the through hole TH to be electrically connected to the electronic device 10.

The terminal 20 is provided to the second member 32 to be described. Specifically, the terminal 20 is made up of a part such as the deformable portion 21 arranged in a housing space s2, a part embedded in the second member 32, and a part arranged outside the housing space s2, the parts being arranged in an integrated manner. In this example, however, the part embedded in the second member 32 and the part arranged outside the housing space s2 are omitted from the figure.

Each of the first member 31 and the second member 32 corresponds to a housing member. That is, the first member 31 and the second member 32 are a case housing the electronic device 10.

As illustrated in FIG. 1, the first member 31 is a lid closing an opening of the case-like second member 32 and is joined to the second member 32 to form the housing space s2 for the electronic device 10. The first member 31 also includes a part facing a surface of the substrate 11 of the electronic device 10 and is mechanically connected to the electronic device 10 via an adhesive 40, the surface of the substrate having the cap 13 mounted thereon. The present embodiment illustrates an example where the first member 31 and the molding resin 12 of the electronic device 10 are mechanically connected to each other via the adhesive 40.

The first member 31 is made of metal and thus has a function as a heat dissipating member. That is, the first member 31 dissipates heat generated from the electronic device 10 from the side of the molding resin 12. Specifically, the first member 31 dissipates heat generated by the operation of the electronic component 14 provided in the electronic device 10. A metal plate can thus be employed as the first member 31. A thermal adhesive is employed as the adhesive 40 in order to convey the heat generated from the electronic device 10 to the first member 31. That is, the adhesive 40 has a function of mechanically connecting the molding resin 12 and the first member 31, and a function of conveying the heat generated from the electronic device 10 to the first member 31. The adhesive 40 corresponds to a member having a heat dissipation property.

As described above, the present embodiment adopts the example where the first member 31 and the electronic device 10 are mechanically connected to each other via the adhesive 40. The present disclosure is however not limited to such an example. The present disclosure may be adapted such that the first member 31 and the electronic device 10 are in contact with each other via silicone-based thermal grease, for example. That is, the first member 31 and the electronic device 10 need only be in contact with each other via a member having a function to convey the heat generated from the electronic device 10 to the first member 31. Note that the thermal grease can also be employed instead of the adhesive 40 in a variation to be described.

The second member 32 is joined to the first member 31 to form the housing space s2, includes a part facing a surface of the substrate 11 at which the cap 13 is not mounted, and is provided with the terminal 20 protruded into the housing space s2. The second member 32 is a case-like member having a bottom and an annular side wall protruded from the bottom. In other words, the second member 32 is a case member with one open surface. The edge of the side wall of the second member 32 is joined to the first member 31, which closes the opening of the second member. Note that the bottom includes a part facing the surface of the substrate 11 at which the cap 13 is not mounted.

The second member 32 is made of resin, for example, where the terminal 20 is insert-molded into the member. The second member 32 employed in the present embodiment is provided with the terminal 20, a part of which projects into the housing space s2 from the bottom.

Figure 3:
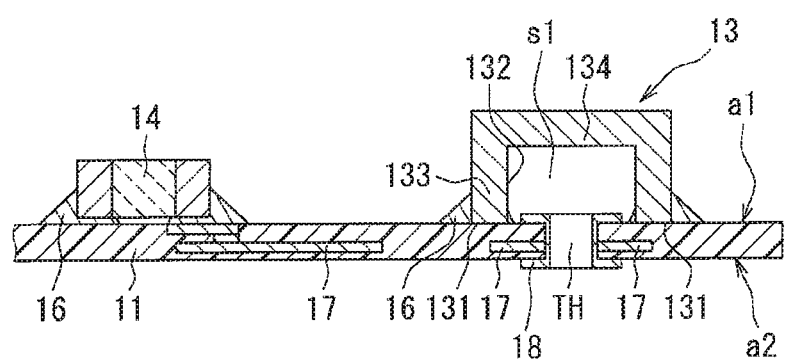
FIG. 3 is a cross-sectional view taken along a line III-III of FIG. 2.

The electronic device 10 will now be described. As illustrated in FIG. 1 or the like, the electronic device 10 includes a circuit board and the molding resin 12. As illustrated in FIGS. 1, 3 and the like, the circuit board includes the insulating substrate 11, a wiring 17 arranged in the substrate 11, and the electronic component 14 mounted at the substrate 11 to be electrically connected to the wiring 17. Also arranged in the electronic device 10 is the through hole TH which is arranged through the substrate 11 from a surface a1 of the substrate 11 to an opposite surface a2 opposite to the surface a1, and which includes the conductive member 18 arranged at the surface of the through hole to be electrically connected to the wiring 17.

The substrate 11 is made of an insulating material such as resin or ceramic. The substrate 11 is plate-shaped and includes the surface a1 and the opposite surface a2 opposite to the surface a1, for example. A so-called build-up substrate in which a core layer and a plurality of build-up layers are stacked at top of one another or a so-called any layer substrate in which a plurality of build-up layers is stacked at top of one another can be employed as the substrate 11, for example. Although not described in detail, a laser via hole and a blind via hole as interlayer connection members are also arranged in the substrate 11.

Figure 2:
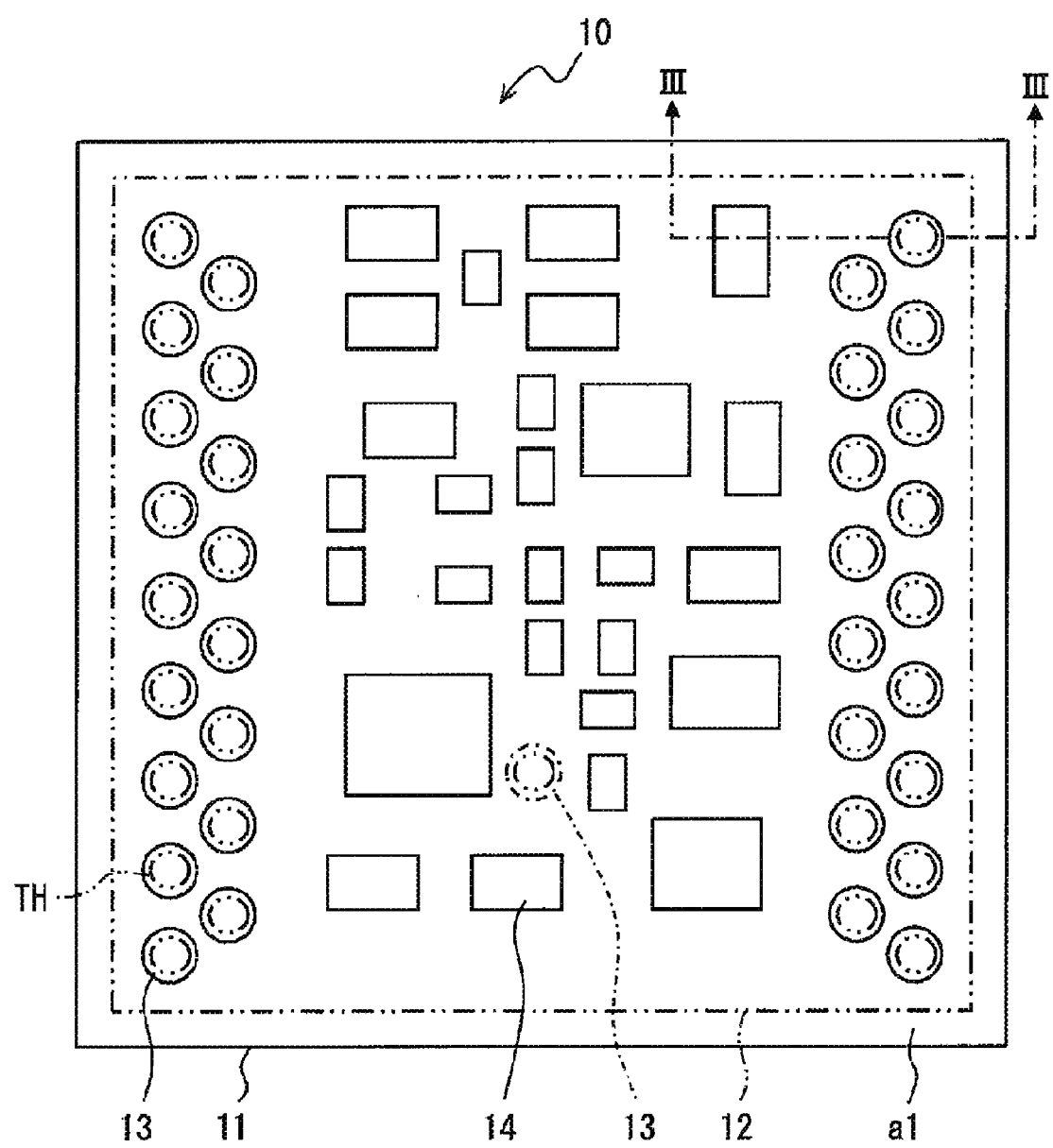
FIG. 2 is a plan view illustrating a schematic structure of an electronic device according to the embodiment.

At least one of the through hole TH is arranged through the substrate 11. The substrate 11 employed in the present embodiment includes a plurality of the through holes TH arranged through the substrate as illustrated in FIG. 2. Specifically, the present embodiment illustrates an example where two rows of the through holes TH are provided at each of two ends of the substrate 11. The through hole TH is a part provided to electrically connect the terminal 20 and the wiring 17, and is equal or greater in number to/than the number of the terminals 20 of the external device. One opening of each of the through holes TH is covered with the cap 13. The cap 13 will be described later.

The wiring 17 is made of a conductive member and arranged inside and/or at the surface of the substrate 11. The wiring 17 is arranged into foil, for example. The wiring 17 also includes, as a part thereof, a land at which the electronic component 14 is mounted. Note that the structure in which the wiring 17 and the through holes TH are arranged in the substrate 11 can also be referred to as a printed circuit board.

The electronic component 14 is mounted at the surface a1 of the substrate 11 to be electrically connected to the wiring 17 and the like. The present embodiment illustrates an example where a plurality of the electronic components 14 is mounted as illustrated in FIG. 2. The electronic component 14 is an element sealed with the molding resin 12 to be described. A MOSFET and/or a chip capacitor can be employed as the electronic component 14, for example. Moreover, the electronic component 14 is mounted at the substrate 11 via solder 16. The solder 16 corresponds to a conductive connection member. Note that the electronic component 14 may be mounted at the substrate 11 via a conductive adhesive different from the solder 16.

An extra-resin element 15 not sealed with the molding resin 12 is mounted at the opposite surface a2 of the substrate 11. That is, it can be said that the electronic device 10 includes a double-sided mounting board. The present disclosure is however not limited to such an example. The electronic device 10 including a single-sided mounting board where the electronic component 14 is mounted at one side of the substrate 11 can also be employed. Note that the extra-resin element 15 corresponds to a back circuit element.

The molding resin 12 corresponds to a sealing resin. The molding resin 12 is made of an epoxy resin or the like to seal the electronic component 14. In addition to the electronic component 14, the molding resin 12 integrally seals a connection part between the electronic component 14 and the substrate 11. The molding resin 12 seals the electronic component 14 and the like while in intimate contact with at least a part of the surface a1 of the substrate 11. In other words, the molding resin 12 integrally seals the electronic component 14 and the periphery of the electronic component 14 at the surface a1. Note that the molding resin 12 is mechanically connected to the first member 31 via the adhesive 40 as illustrated in FIG. 1. Specifically, the molding resin 12 is mechanically connected to the first member 31 via the adhesive 40 that is arranged at a surface parallel to the surface a1 of the substrate 11.

Figure 4:
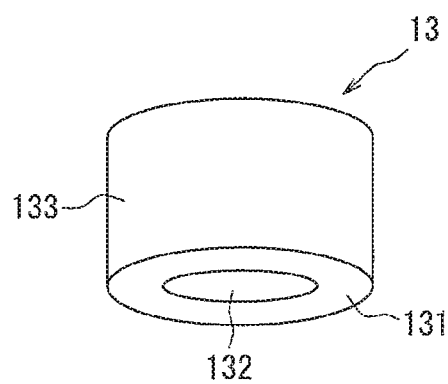
FIG. 4 is a perspective view illustrating a schematic structure of a cap according to the embodiment.

As illustrated in FIGS. 3 and 4, the cap 13 is mounted at the substrate 11 and includes an annular connection 131 connected to the substrate 11 and a recess 132 arranged in a recessed manner relative to the connection 131. The recess 132 is arranged of a ceiling 134 and an annular side wall 133 protruded from the ceiling 134. In other words, the cap 13 is a cylindrical member with a bottom at one end.

The present embodiment employs the cap 13 having the shape of a hollowed out cylinder. The present disclosure is however not limited to such an example. The present disclosure can employ, for example, the cap 13 having the shape of a hollowed out hemisphere or a bowl.

The cap 13 is arranged such that the connection 131 is mechanically connected to the substrate 11 while the recess 132 faces an open end of the through hole TH at the side of the surface a1. That is, the cap 13 is arranged such that the annular connection 131 is mechanically connected around the through hole TH. The cap 13 is connected to the substrate 11 in such a manner to form the space s1 communicating with the through hole TH. Moreover, as illustrated in FIGS. 1 and 2, the molding resin 12 seals the cap 13 and the electronic component 14 integrally. The cap 13 is thus arranged while facing not both but one of the open ends of the through hole TH of interest. A tip of the terminal 20 is arranged in the space s1. Note that FIG. 2 indicates the molding resin 12 and the through hole TH with two-dot chain lines for clearer illustration of the drawing.

As illustrated in FIG. 2, the cap 13 is individually provided for each of the plurality of through holes. That is, the electronic device 10 includes the caps 13 equal in number to the number of the through holes TH, where one cap 13 is provided for one through hole TH. It can thus be said that the caps 13 are provided separately. Note that the cap 13 illustrated with a one-dot chain line in FIG. 2 is a virtual cap illustrated to describe an effect of the present disclosure.

The cap 13 is made of metal, resin, or ceramic, for example. The cap 13 made of metal is employed in the present embodiment. The cap 13 can thus be mounted at the substrate 11 via the solder 16. Moreover, as illustrated in FIGS. 2 and 3, the cap 13 is mounted at the surface a1 at which the electronic component 14 is mounted. That is, the cap 13 and the electronic component 14 are mounted at the same surface of the substrate 11. The cap 13 can thus be mounted at the substrate 11 together with the electronic component 14. In other words, the cap 13 and the electronic component 14 can be mounted at the substrate 11 in the same process. Note that the cap 13 and the electronic component 14 can be mounted at the substrate 11 in the same process as long as at least the connection 131 is made of metal.

Figure 5:
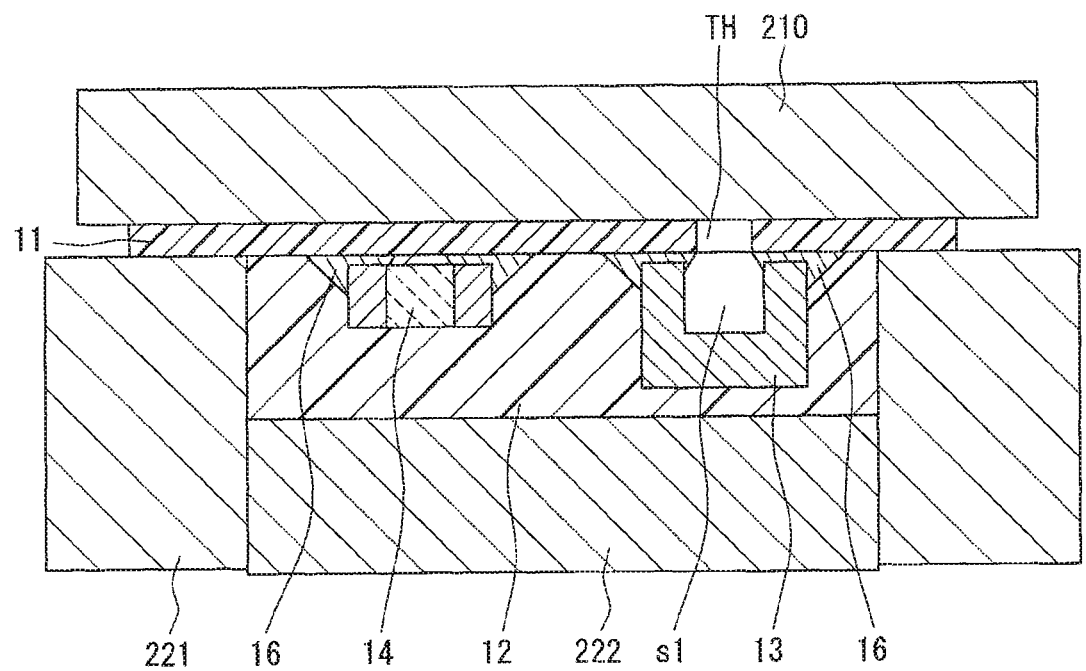
FIG. 5 is a cross-sectional view illustrating a process of manufacturing the electronic device according the an embodiment.

The molding resin 12 that seals the cap 13 and the electronic component 14 can be arranged by compression molding or transfer molding, for example. An example of a molding process that forms the molding resin 12 by the compression molding will be described with reference to FIG. 5. The molding process uses, as a mold, an upper mold 210 and a lower mold including a fixed portion 221 and a movable portion 222.

The upper mold 210 has a flat contact surface to be in contact with the opposite surface a2 of the substrate 11. The lower mold includes the fixed portion 221 provided with a hole and the movable portion 222 that can move along the hole inside the hole. The fixed portion 221 and the movable portion 222 of the lower mold form a cavity in which a resin material to be the molding resin 12 is disposed.

Note that the movable portion 222 can move up and down in the hole of the fixed portion 221. In other words, the movable portion 222 can move in a direction to approach the upper mold 210 and a direction away from the upper mold 210 while the electronic device 10 before being molded is fixed by the upper mold 210 and the fixed portion 221.

Then in the molding process, the contact surface of the upper mold 210 is brought into contact with the opposite surface a2 of the substrate 11 while at the same time the fixed portion 221 is brought into contact with the surface a1 of the electronic device 10. At this time, the fixed portion 221 of the lower mold is brought into contact with the surface a1 of the electronic device 10 such that the cavity faces an area, in which the cap 13 and the electronic component 14 are mounted, at the surface a1 of the substrate 11.

After that, in the molding process, the movable portion 222 is moved toward the upper mold 210 while the resin material is filled in the cavity to apply a formation pressure to the resin material. The mold is heated to a predetermined temperature at this time in order to apply heat to the resin material. Then in the molding process, the molding resin 12 is arranged by curing the resin material while the formation pressure is applied thereto. The cap 13 and the electronic component 14 are thus sealed collectively in the molding process. The electronic device 10 can prevent the resin material from getting into the through hole TH since the cap 13 is placed over the through hole TH. Accordingly, the electronic device 10 can have the cap 13 that is hollow even after the molding resin 12 is provided.

A method of manufacturing the electronic structure 100 will now be described. In a first process, the electronic device 10 and the first member 31 are mechanically connected via the adhesive 40. In the first process, the molding resin 12 of the electronic device 10 and the first member 31 are mechanically connected via the adhesive 40 with the molding resin 12 and the first member 31 facing each other. What is manufactured by mechanically connecting the electronic device 10 and the first member 31 in the first process will also be hereinafter referred to as a first structure.

In a second process following the first process, the first structure is assembled to the second member 32. In the second process, the first member 31 is joined to the end of the side wall of the second member 32 with the electronic device 10 arranged in the space enclosed by the bottom and the annular side wall of the second member 32. Note that the first member 31 is joined to the end of the side wall of the second member 32 to close the opening of the second member 32.

Moreover, in the second process, the electronic device 10 is arranged in the space enclosed by the bottom and the annular side wall while the terminal 20 is press-fitted into the through hole TH. In order for the terminal 20 to be press-fitted into the through hole TH in the second process, the first structure is pressed toward the bottom of the second member 32 from the opening side of the second member 32 with the through hole TH and the terminal 20 aligned. The electronic device 10 is thus arranged in the housing space s2 while being mechanically connected to the first member 31.

The present disclosure is however not limited to such an example. The electronic structure 100 can also be manufactured by a second manufacturing method in which the first member 31 is joined to the second member 32 after the electronic device 10 is assembled to the second member 32. In an initial process of the second manufacturing method, the electronic device 10 is arranged in the space enclosed by the bottom and the annular side wall of the second member 32. In this process, the electronic device 10 is arranged in the space enclosed by the bottom and the annular side wall while the terminal 20 is press-fitted into the through hole TH. Moreover, in order for the terminal 20 to be press-fitted into the through hole TH in this process, the electronic device 10 is pressed toward the bottom of the second member 32 from the opening side of the second member 32 while the through hole TH and the terminal 20 are aligned. The electronic device 10 is thus electrically connected to the terminal 20 and assembled to the second member 32. What is manufactured by assembling the electronic device 10 and the second member 32 in the initial process will also be hereinafter referred to as a second structure.

In a process following the initial process, the first member 31 is assembled to the second structure. In this process, the first member 31 is joined to the end of the side wall of the second member 32. Note that the first member 31 is joined to the end of the side wall of the second member 32 to close the opening of the second member 32. When the first member 31 is joined to the second member 32 in this process, the first member 31 and the electronic device 10 are mechanically connected via the adhesive 40. In the second manufacturing method, however, the molding resin 12 may be brought into contact with the first member 31 via thermal grease instead of the adhesive 40.

The electronic device 10 is configured such that the terminal 20 is inserted into the through hole TH provided through the substrate 11, as has been described. The electronic device 10 further includes the cap 13 having the annular connection 131 connected to the substrate 11 and the recess 132 arranged in the recessed manner relative to the connection 131. The cap 13 forms the space s1 communicating with the through hole TH by connecting the connection 131 to the substrate 11 with the recess 132 facing the open end of the through hole TH, and is sealed integrally with the electronic component 14 by the molding resin 12. That is, the electronic device 10 is configured such that the cap 13 is placed over the open end of the through hole TH and sealed with the molding resin 12.

The electronic device 10 is thus configured such that the tip of the terminal 20 inserted into the through hole TH is covered with the cap 13 and the molding resin 12 even when the tip of the terminal is exposed from the through hole TH. In other words, even when exposed from the through hole TH, the tip of the terminal 20 in the electronic device 10 is merely arranged in the space s1 communicating with the through hole TH and is not exposed to the outside of the molding resin 12. The electronic device 10 can therefore ensure insulation between the terminal 20 and a different potential member when the terminal 20 is inserted into the through hole TH. That is, the electronic device 10 does not require special processing to prevent a short circuit between the terminal 20 and the first member 31 or the like.

The cap 13 is placed over the through hole TH of the electronic device 10. The electronic device 10 can thus prevent the molding resin 12 from getting into the through hole TH when the molding resin 12 is provided. Accordingly, degradation in electrical connectivity between the conductive member 18 and the terminal 20 can be prevented in the electronic device 10.

The electronic device 10 uses the cap 13 to prevent the molding resin 12 from getting into the through hole TH. Therefore, when the molding resin 12 is to be provided to the substrate 11 with the through hole TH arranged at a different position, the electronic device 10 need only change the position of the cap 13 in accordance with the position of the through hole TH so that the mold need not be machined.

The aforementioned point will be described with reference to FIG. 2. The electronic device 10 employed in the present embodiment includes two rows of the through holes TH arranged in each of the two ends of the substrate 11 and the cap 13 provided to each of the through holes TH, as illustrated in the example in FIG. 2. However, in contrast to the electronic device 10, the present disclosure can employ an electronic device (hereinafter noted as a modified electronic device) provided with the cap 13 indicated with the one-dot chain line and a through hole TH arranged at the position facing the cap 13. That is, the modified electronic device includes two rows of the through holes TH arranged in each of the two ends of the substrate 11, the through hole TH arranged at the position different from the two ends of the substrate 11, and the cap 13 provided for each of the through holes TH.

Although the positions of the through holes TH are different between the electronic device 10 and the modified electronic device, the cap 13 is placed over each of the through holes TH to prevent the molding resin 12 from getting into the through holes TH. The same mold can thus be used to manufacture the electronic device 10 and the modified electronic device by changing the position of the cap 13 in accordance with the position of the through hole TH though the devices include the through holes TH at the different positions. Therefore, the electronic device 10 can have an increased degree of flexibility in terms of the position of the through hole TH.

The electronic device 10 is configured such that the cap 13 is placed over the open end of the through hole TH and sealed with the molding resin 12, whereby the area around the through hole TH can be increased in strength. Accordingly, the electronic device 10 can prevent the substrate 11 from being distorted by the stress from the terminal 20 when the terminal 20 is press-fitted into the through hole TH. That is, the electronic device 10 can prevent the distortion of the substrate 11 without reinforcing the periphery of the through hole TH with a jig. The distortion of the substrate 11 being prevented, the electronic device 10 can prevent a break in the wiring 17 caused by the distortion of the substrate 11.

The electronic structure 100 forms the housing space s2 with the first member 31 and the second member 32 to house the electronic device 10 in the housing space s2. The electronic structure 100 can thus prevent a foreign matter from adhering to the electronic device 10. Moreover, the first member 31 made of metal is mechanically connected to the electronic device 10 in the electronic structure 100. The electronic structure 100 can thus dissipate heat through the first member 31 even when heat is generated from the electronic device 10. Note that the electronic structure 100 can also dissipate the heat generated from the electronic device 10 when the electronic device 10 and the first member 31 are in contact with each other via the thermal grease.

The electronic device 10 can also ensure insulation between the terminal 20 and the different potential member, as described above. The electronic structure 100 can thus ensure insulation between the terminal 20 and the first member 31 even when the first member 31 is made of metal and includes the part facing the surface of the substrate 11 at which the cap 13 is mounted.

A preferred embodiment of the present disclosure has been described. However, the present disclosure is not to be limited to the aforementioned embodiment but can be modified in various ways without departing from the intent of the present disclosure. First to eighth variations of the present disclosure will now be described. The aforementioned embodiment and the first to eighth variations can be implemented individually or combined as appropriate and implemented. The present disclosure can be implemented by various combinations not limited those illustrated in the embodiments.

(First Variation)

Figure 6:
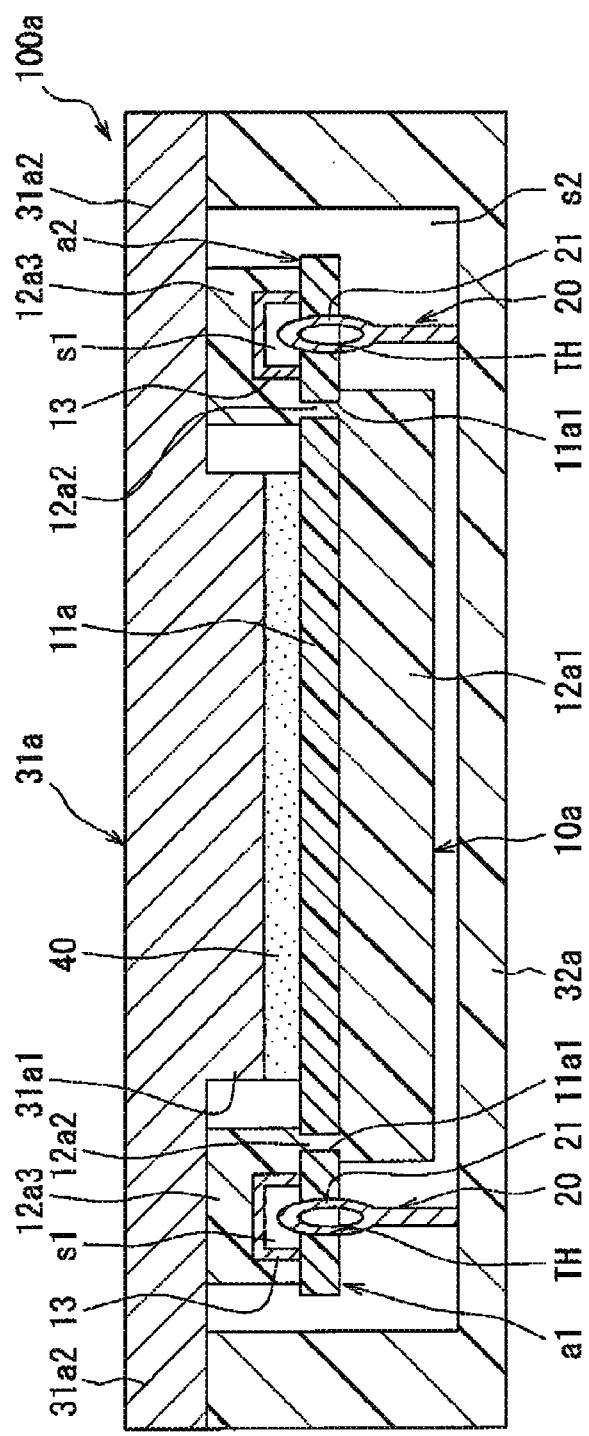
FIG. 6 is a cross-sectional view illustrating a schematic structure of an electronic structure according to a first variation.

According to an electronic device 10a of a first variation, a cap 13 is mounted at a reverse side of a surface, at which an electronic component 14 is mounted, of a substrate 11a as illustrated in FIG. 6. In the electronic device 10a being employed, the electronic component 14 is mounted at a surface a1 of the substrate 11a while the cap 13 is mounted at an opposite surface a2 of the substrate 11a.

The cap 13 and the electronic component 14 being mounted separately at the surface a1 and the opposite surface a2 of the substrate 11a, the electronic device 10a includes a molding resin arranged of a plurality of parts. That is, the molding resin is arranged of an element sealing part 12a1, a cap sealing part 12a3, and a connecting part 12a2. The element sealing part 12a1 is provided at the surface a1 to seal the electronic component 14. The cap sealing part 12a3 is provided at the opposite surface a2 to seal the cap 13. The connecting part 12a2 is a part connecting the element sealing part 12a1 and the cap sealing part 12a3. Note that the cap sealing part 12a3 corresponds to a part covering the cap.

The substrate 11a is provided with a through hole 11a1 for collective molding of the parts of the molding resin. At the time of molding, in the electronic device 10a, a resin material to be the molding resin passes through the through hole 11a1 so that the element sealing part 12a1 and the cap sealing part 12a3 are molded. The connecting part 12a2 is thus provided inside the through hole 11a1. Note that a mold used in the molding of the electronic device 10a includes a space that forms the element sealing part 12a1 and a space that forms the cap sealing part 12a3, where the spaces communicate with each other via the through hole 11a1. The electronic device 10a can obtain an effect similar to that of the electronic device 10.

An electronic structure 100a of the first variation includes a terminal 20, a first member 31a and a second member 32a in addition to the electronic device 10a. Note that the second member 32a will not be described as it is similar to the second member 32.

The first member 31a is a part mechanically connected to the electronic device 10a and includes a protrusion 31a1 protruded relative to the periphery. That is, the first member 31a includes the protrusion 31a1 and a peripheral part 31a2 provided around the protrusion 31a1 and arranged in a recessed manner relative to the protrusion 31a1. In other words, the protrusion 31a1 and the peripheral part 31a2 of the first member 31a form a difference in level at the side facing the electronic device 10a with the protrusion 31a1 protruded from the peripheral part 31a2. The protrusion 31a1 is arranged thinner than the cap sealing part 12a3. A difference in thickness between the protrusion 31a1 and the cap sealing part 12a3 corresponds to the thickness of an adhesive 40.

Note that the thickness of the protrusion 31a1 corresponds to a gap between a virtual plane along a surface of the peripheral part 31a2 at the side of a housing space s2 and a virtual plane along a surface of the protrusion 31a1 at the side of the housing space s2. The thickness of the cap sealing part 12a3 is the thickness of the thickest part of the cap sealing part 12a3 and corresponds to a gap between a virtual plane along a surface of the cap sealing part 12a3 at the side opposite to the substrate 11a and the opposite surface a2 of the substrate 11a. Moreover, the thickness of the cap sealing part 12a3 corresponds to the sum of the height of the cap 13 and the thickness of a part of the cap sealing part 12a3 provided at the cap 13.

The protrusion 31a1 in the electronic structure 100a is mechanically connected to a part of the opposite surface a2 via the adhesive 40. That is, the protrusion 31a1 is connected to the periphery of the cap sealing part 12a3 at the opposite surface a2 of the electronic device 10a. Moreover, in the electronic structure 100a, the cap sealing part 12a3 is in contact with the peripheral part 31a2 with the protrusion 31a1 mechanically connected to the electronic device 10a. It can thus be said that the thickness of the cap sealing part 12a3 corresponds to the sum of the thickness of the protrusion 31a1 and the thickness of the adhesive 40.

The electronic structure 100a can obtain an effect similar to that of the electronic structure 100. According to the electronic structure 100a, the peripheral part 31a2 is brought into contact with the cap sealing part 12a3 at the time of mechanically connecting the first member 31a and the electronic device 10a, so that the thickness of the adhesive 40 is managed more easily than the electronic structure 100. That is, according to the electronic structure 100a, the thickness of the adhesive 40 can be managed by manufacturing each of the cap sealing part 12a3 and the protrusion 31a1 to have the thickness corresponding to a desired thickness of the adhesive 40. In other words, the thickness of the adhesive can be easily managed in the electronic structure 100a by controlling the thickness of the cap sealing part 12a3 and the thickness of the protrusion 31a1. As a result, an area of contact between the first member 31a and the electronic device 10a of the electronic structure 100a is managed more easily. The electronic structure 100a can therefore dissipate heat from the electronic device 10a efficiently.

(Second Variation)

Figure 7:
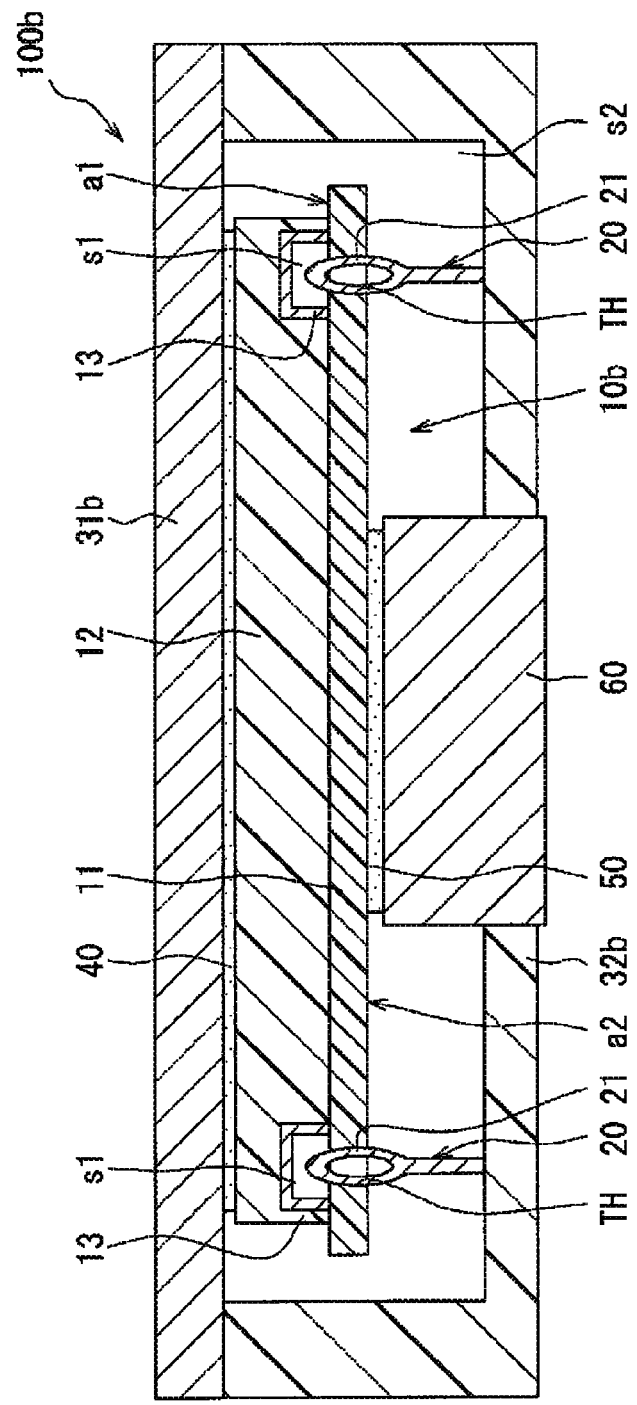
FIG. 7 is a cross-sectional view illustrating a schematic structure of an electronic structure according to a second variation.

An electronic structure 100b of a second variation includes a second member 32b provided with a heat dissipating member 60, as illustrated in FIG. 7. That is, the second member 32b is provided with the heat dissipating member 60 in a part facing a surface of a substrate 11 at which a cap 13 is not mounted, the heat dissipating member being mechanically connected to an electronic device 10b. The heat dissipating member 60 is a block-like member made of metal. The second member 32b is provided with a through hole by which the heat dissipating member 60 is attached, for example. The heat dissipating member 60 is thus provided to the second member 32b while being inserted into the through hole. Note that a first member 31b will not be described as it is similar to the first member 31.

The heat dissipating member 60 is mechanically connected to an opposite surface a2 of the substrate 11 via an adhesive 50. Accordingly, an extra-resin element 15 is not mounted at the opposite surface a2 of the electronic device 10b of the second variation. That is, the electronic device 10b includes a circuit board being a single-sided mounting board. The electronic device 10b includes the circuit board being the single-sided mounting board and is arranged in a housing space s2 arranged of the first member 31b and the second member 32b. The electronic device 10b is configured such that the first member 31b is mechanically connected to the device at the side of a surface a1 while the heat dissipating member 60 is mechanically connected to the device at the side of the opposite surface a2. Note that the adhesive 50 will not be described as it is similar to the adhesive 40.

The electronic structure 100b can obtain an effect similar to that of the electronic structure 100. The electronic structure 100b can dissipate heat generated by the electronic device 10b from both the surface a1 and the opposite surface a2. The electronic structure 100b can thus realize better heat dissipation of the electronic device 10b than the electronic structure 100. Note that the electronic device 10b may also be configured such that the extra-resin element 15 is mounted at the substrate 11 in the periphery of the adhesive 50. Moreover, the heat dissipating member 60 and the electronic device 10b may be in contact with each other via thermal grease instead of the adhesive 50.

(Third Variation)

Figure 8:
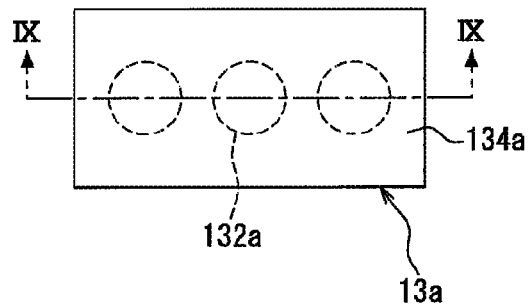
FIG. 8 is a plan view illustrating a schematic structure of a cap according to a third variation.
Figure 9:
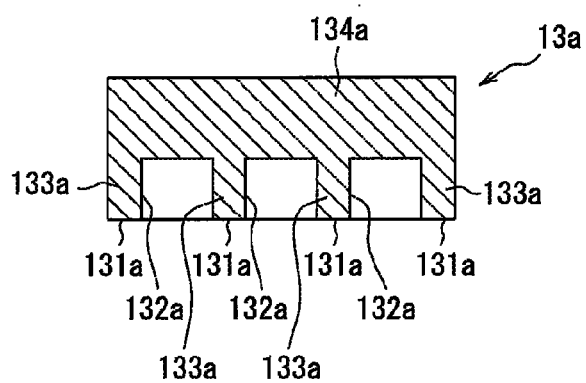
FIG. 9 is a cross-sectional view taken along a line IX-IX of FIG. 8.

An electronic device of a third variation is provided with a cap 13a as illustrated in FIGS. 8 and 9. That is, the electronic device of the third variation is different from the electronic device 10 in terms of the structure of the cap 13a.

As illustrated in FIG. 8, the cap 13a is a one-piece body in which a plurality of recesses 132a is provided while being partitioned from one another. As described in the aforementioned embodiment, a plurality of through holes TH is arranged through a substrate 11. The cap 13a is thus provided with the recesses 132a corresponding to at least two of the plurality of through holes TH. Each of the recesses 132a is arranged of a ceiling 134a and an annular side wall 133a protruded from the ceiling 134a as illustrated in FIG. 9. That is, the recesses 132a are partitioned by the side walls 133a. An end of the side wall 133a is a connection 131a to be connected to the substrate 11. Each of the recesses 132a is a part arranged in a recessed manner relative to the connection 131a. The cap 13a employed in this case is provided with three of the recesses 132a corresponding to three of the through holes TH.

The electronic device according to the third variation can obtain an effect similar to that of the electronic device 10. The electronic device of the third variation employs the cap 13a provided with the plurality of recesses 132a, whereby the through holes TH equal in number to the number of the recesses 132a can be covered collectively.

The present disclosure may also be configured such that the cap 13 and the cap 13a are both mounted at the substrate 11. The electronic device 10 may be configured such that, for example, the cap 13a is mounted in a region of the substrate 11 where the through holes TH are densely arranged, while the cap 13 is mounted in a region where the through holes TH are provided separately. In other words, the electronic device 10 may be configured such that the cap 13a is mounted in a region where the plurality of through holes TH is provided adjacent to one another without interposing an electronic component 14 thereamong, while the cap 13 is mounted in a region where the through holes are provided while interposing the electronic component 14 thereamong.

(Fourth Variation)

Figure 10:
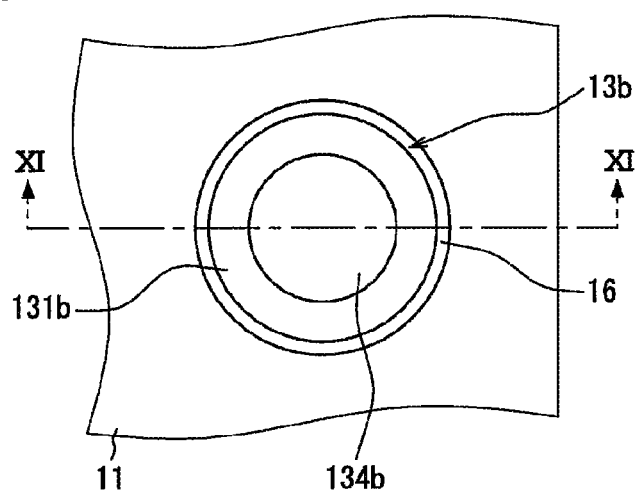
FIG. 10 is a plan view illustrating a schematic structure of a cap according to a fourth variation.
Figure 11:
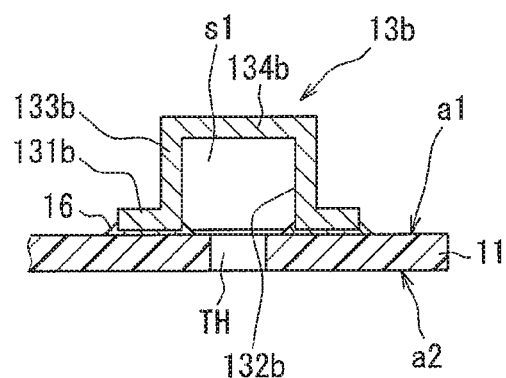
FIG. 11 is a cross-sectional view taken along a line XI-XI of FIG. 10.

An electronic device of a fourth variation is provided with a cap 13b as illustrated in FIGS. 10 and 11. That is, the electronic device of the fourth variation is different from the electronic device 10 in terms of the structure of the cap 13b.

The cap 13b includes a recess 132b and a flange 131b as a connection protruded from the recess 132b, as illustrated in FIG. 11. The recess 132b is arranged of a ceiling 134b and an annular side wall 133b protruded from the ceiling 134b. The flange 131b is provided along a plane of a substrate 11 while protruded from an end of the side wall 133b to the outer side of the recess 132b. The flange 131b is provided all around the side wall 133b as illustrated in FIG. 10. It can also be said that the flange 131b is provided to extend to the outer side relative to the side wall 133b, or to the side opposite from the recess 132b. Note that the plane of the substrate 11 is a surface of the substrate 11 at which the cap 13b is mounted, and is a surface a1 in this case.

The electronic device according to the fourth variation can obtain an effect similar to that of the electronic device 10. The electronic device of the fourth variation employs the cap 13b having the flange 131b so that the cap 13b and the substrate 11 can be mechanically connected to each other more strongly. As a result, the electronic device of the fourth variation can better prevent a molding resin 12 from leaking out into a through hole TH. Therefore, degradation in electrical connectivity between a conductive member 18 and a terminal 20 can be better prevented in the electronic device of the fourth variation.

Note that the present variation employs the example where the flange 131b is provided all around the side wall 133b. The present disclosure is however not limited to such an example. The cap 13b may be configured such that the flange 131b is provided partly around the circumference of the end of the side wall 133b, when the end face of the side wall 133b is provided annularly.

(Fifth Variation)

Figure 12:
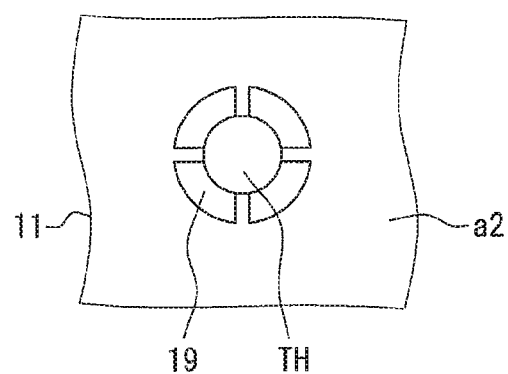
FIG. 12 is a plan view illustrating a schematic structure of a substrate according to a fifth variation.

According to an electronic device of a fifth variation, as illustrated in FIG. 12, a plurality of lands 19 is provided at intervals in a region of a substrate 11 opposing a connection 131. The electronic device of the fifth variation is thus different from the electronic device 10 of the aforementioned embodiment in terms of the structure of the substrate 11 at which the lands 19 are provided. For the sake of convenience, however, a description will be provided while using the same reference numeral as that used in the aforementioned embodiment.

A cap 13 is mounted at the substrate 11 via the plurality of lands 19. The cap 13 is thus mechanically connected to the substrate 11 partly. In other words, the connection 131 of the cap 13 includes a part connected to the substrate 11 and a part not connected to the substrate 11. A gap is arranged partly between the substrate 11 and the connection 131.

In the electronic device of the fifth variation, the plurality of lands 19 is provided at intervals to function as an air vent at the time of molding a molding resin 12. The plurality of lands 19 is provided at intervals to allow the air to pass through and prevent a resin material to be the molding resin 12 from leaking out at the time of molding. The lands 19 are usually arranged thin enough to allow the air to pass through and prevent the resin material to be the molding resin 12 from leaking out at the time of molding.

As a result, the electronic device of the fifth variation can allow the air within a cavity of a mold to vent while preventing the resin material to be the molding resin 12 from leaking out through the gap between the substrate 11 and the connection 131, namely through the intervals among the plurality of lands 19, at the time of molding the molding resin 12. That is, the electronic device of the fifth variation can allow the air to vent into a through hole TH through the intervals arranged among the plurality of lands 19 at the time of molding.

The electronic device according to the fifth variation can obtain an effect similar to that of the electronic device 10. The electronic device of the fifth variation can allow the air to vent at the time of molding to be able to prevent formation of air bubbles in the molding resin 12. That is, the electronic device of the fifth variation includes the molding resin 12 without any air bubbles or with few air bubbles.

Note that the technique described in the fifth variation can also be applied to another variation. That is, the cap 13a and/or the cap 13b may be mounted at the substrate 11 via the plurality of lands 19.

(Sixth Variation)

Figure 14:
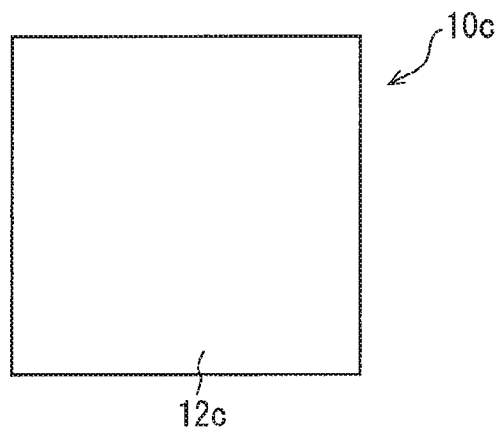
FIG. 14 is a bottom view illustrating a schematic structure of an electronic device according to the sixth variation.
Figure 15:
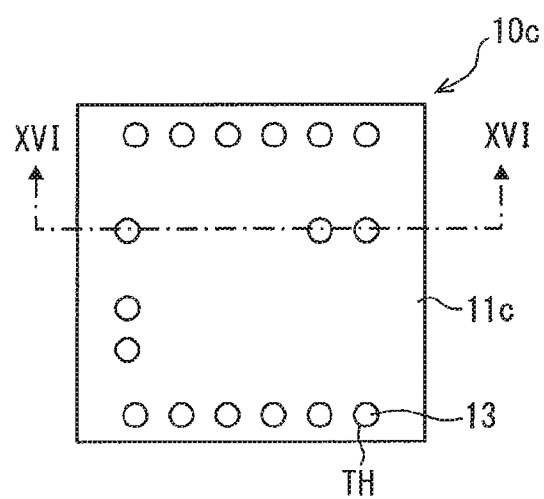
FIG. 15 is a top view illustrating a schematic structure of the electronic device according to the sixth variation.
Figure 16:
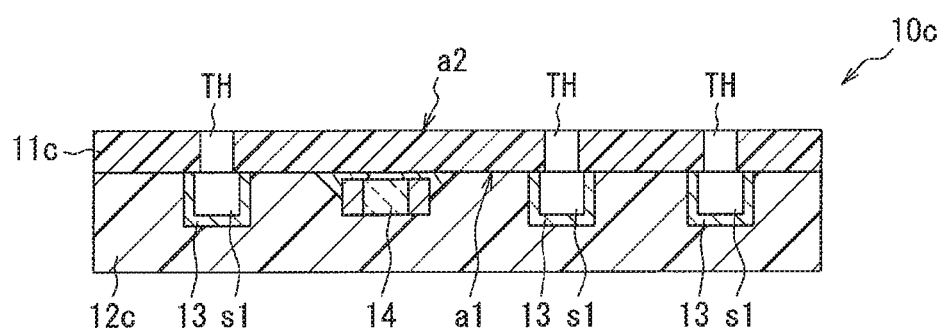
FIG. 16 is a cross-sectional view taken along a line XVI-XVI of FIG. 15.

In an electronic device 10c of a sixth variation, as illustrated in FIGS. 14 to 16, a molding resin 12c covers an entire surface of a substrate 11c at which an electronic component 14 is mounted. That is, a surface a1 of the substrate 11c is entirely covered with the molding resin 12c.

Only the molding resin 12c is visible when the electronic device 10c is seen from the side of the molding resin 12c as illustrated in FIG. 14. When the electronic device 10c is seen from the side of the substrate 11c as illustrated in FIG. 15, the substrate 11c, a through hole TH, and a cap 13 through the through hole TH are visible. Moreover, as illustrated in FIG. 16, the electronic device 10c is arranged such that a side face of the substrate 11c is flush with a side face of the molding resin 12c. The electronic device 10c can obtain an effect similar to that of the electronic device 10.

Figure 13:
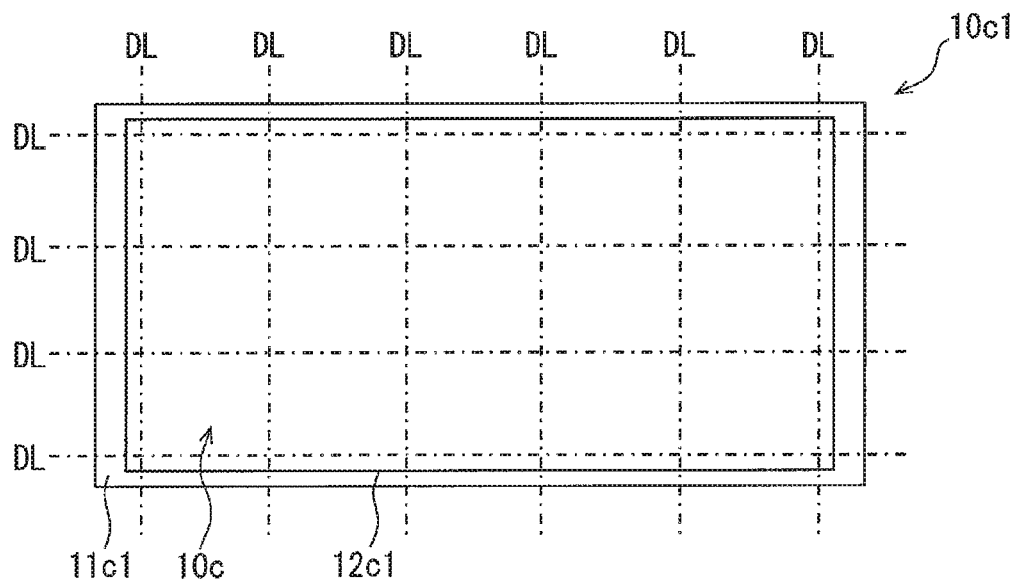
FIG. 13 is a plan view illustrating a schematic structure of a base substrate according to a sixth variation.

The electronic device 10c can be manufactured by dicing a base substrate 10c1 along a dicing line DL as illustrated in FIG. 13, for example. A plurality of regions to be a plurality of the electronic devices 10c is arranged at the base substrate 10c1. That is, at the base substrate 10c1, the cap 13 and the electronic component 14 are mounted at a substrate 11c1 before being divided into a plurality of the substrates 11c, the substrate being sealed with the molding resin 12c1 before the cap 13 and the electronic component 14 are divided. It can be said that 15 pieces of the electronic devices 10c are arranged in an integrated manner at the base substrate 10c1 illustrated in FIG. 13. Therefore, the base substrate 10c1 is divided into 15 pieces of the electronic devices 10c when diced along the dicing line DL.

(Seventh Variation)

Figure 17:
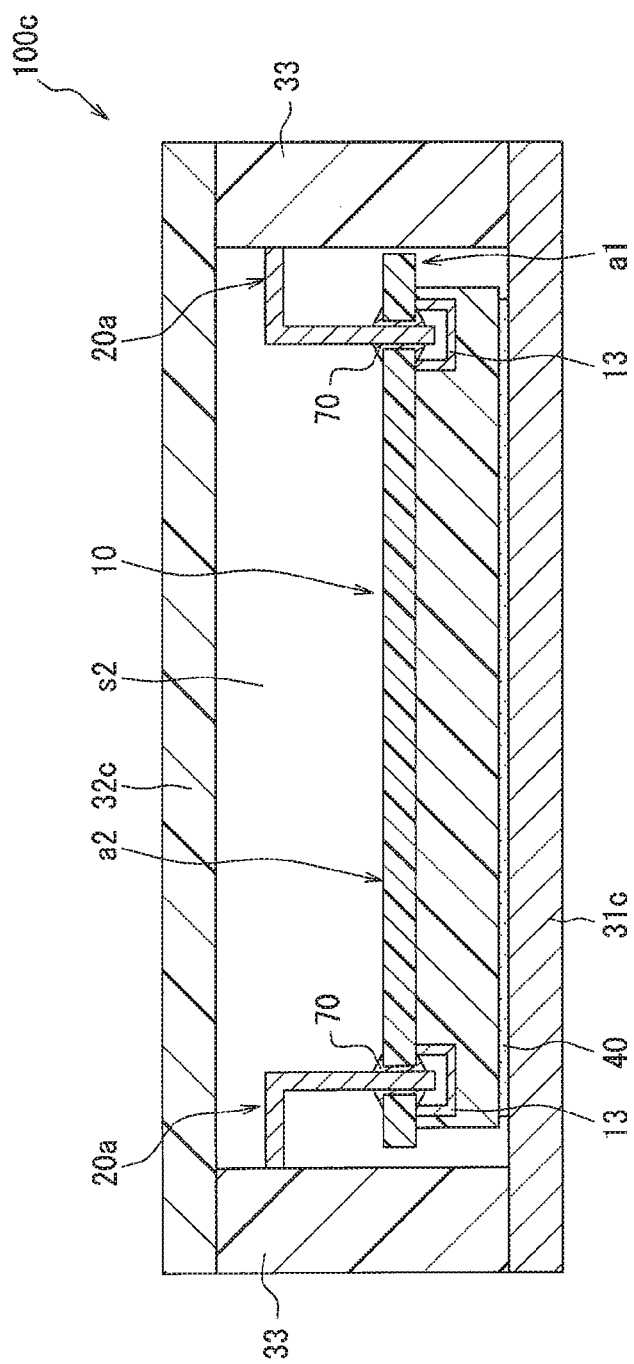
FIG. 17 is a cross-sectional view illustrating a schematic structure of an electronic structure according to a seventh variation.

As illustrated in FIG. 17, an electronic structure 100c of a seventh variation includes a terminal 20a that is not a press-fitted terminal like the terminal 20. The electronic structure 100c includes the terminal 20a, a first member 31c similar to the first member 31, and a second member being a lid 32c and a side wall 33. Note that an extra-resin element 15, a wiring 17, a conductive member 18 and the like of an electronic device 10 are omitted in FIG. 17. The aforementioned embodiment may be referenced regarding the description of the electronic device 10.

The terminal 20a is inserted into a through hole TH and electrically connected to the conductive member 18 via a solder 70. That is, the terminal 20a is electrically connected to the conductive member 18 without being in direct contact with the through hole TH.

The electronic structure 100c includes the lid 32c and the side wall 33 separately as the second member in order for the terminal 20a and the conductive member 18 to be electrically connected easily via the solder 70. That is, it can be said that the electronic structure 100c separately includes the bottom and the side wall of the second member 32. The lid 32c corresponds to the bottom of the second member 32, and the side wall 33 corresponds to the side wall of the second member 32. The side wall 33 has one opening closed by the first member 31c and another opening closed by the lid 32c. Note that the electronic device is mechanically connected to the first member 31c via an adhesive 40, as with the aforementioned embodiment.

The lid 32c can be a plate-like member as with the first member 31c, for example. On the other hand, the side wall 33 is a cylindrical member into which the terminal 20a is insert-molded, for example. An L-shaped bend of the terminal 20a is arranged in a housing space s2.

The electronic structure 100c can be manufactured by the following process, for example. In a first process, the electronic device 10 is mechanically connected to the first member 31c via the adhesive 40. In a next process, with the first member 31c and the electronic device 10 being mechanically connected, the side wall 33 is joined to the first member 31c while the terminal 20a provided in the side wall 33 is inserted into the through hole TH. The one opening of the side wall 33 is thus closed by the first member 31c.

In a following process, the conductive member 18 and the terminal 20a inserted into the through hole TH are electrically connected via the solder 70. In a following process, the lid 32c is joined to the side wall 33. The other opening of the side wall 33 is thus closed by the lid 32c. That is, the two openings of the side wall 33 are closed by the first member 31c and the lid 32c, respectively. As a result, the electronic device is housed in the housing space s2 arranged of the first member 31c, the lid 32c, and the side wall 33.

The object of the present disclosure can be achieved by the electronic device 10 in which the terminal 20a is inserted into the through hole TH as described above. The electronic structure 100c can further obtain an effect similar to that of the electronic structure 100. Note that the terminal 20a may be electrically connected to the conductive member 18 via a conductive adhesive different from the solder 70. That is, the terminal 20a need only be electrically connected to the conductive member 18 via a conductive connection member.

(Eighth Variation)

Figure 18:
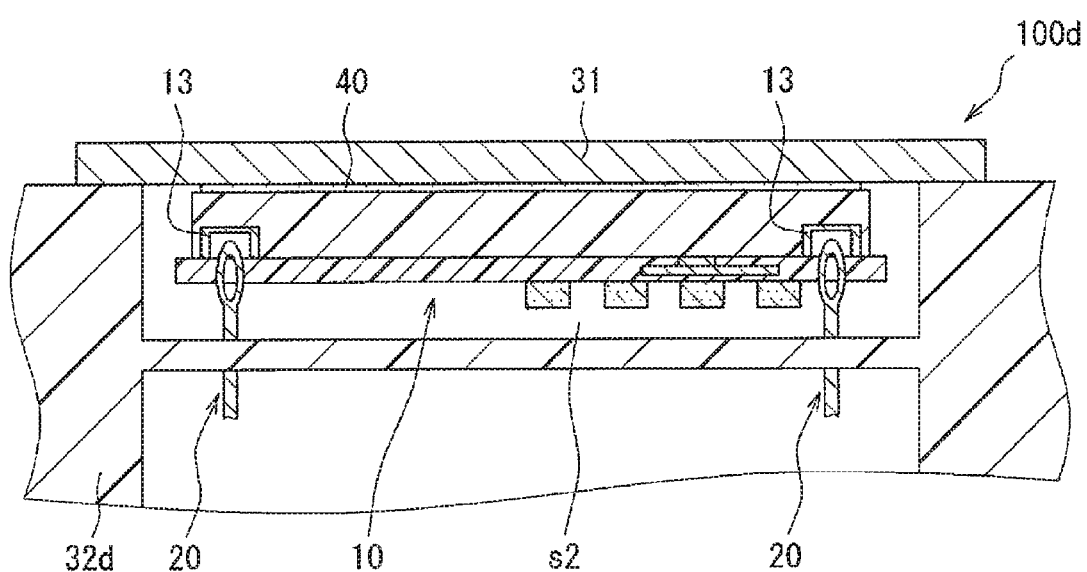
FIG. 18 is a cross-sectional view illustrating a schematic structure of an electronic structure according to an eighth variation.

In an electronic structure 100d of an eighth variation, a second member 32d may be a part of an external device as illustrated in FIG. 18. That is, a terminal 20 may be provided in the external device. According to the electronic structure 100d, an electronic device 10 is integrally assembled to the external device. The object of the present disclosure can be achieved by the electronic device 10 that is provided in the electronic structure 100d as described above. Moreover, the electronic structure 100d can obtain an effect similar to that of the electronic structure 100.

While the present disclosure has been described with reference to embodiments thereof, it is to be understood that the disclosure is not limited to the embodiments and constructions. The present disclosure is intended to cover various modification and equivalent arrangements. In addition, the various combinations and configurations, other combinations and configurations, including more, less or only a single element, are also within the spirit and scope of the present disclosure.

The invention claimed is:

1. An electronic device comprising:
   a circuit board including
      an insulating substrate,
      a wiring arranged at the substrate,
      an electronic component mounted at the substrate and electrically connected to the wiring,
      at least one through hole which is arranged through the substrate from one surface of the substrate to an opposite surface of the one surface of the substrate, and
      a conductive member arranged at a surface of the through hole and electrically connected to the wiring; and the electronic device further comprising:
   a sealing resin that seals the electronic component; and
   a cap that is mounted at the substrate, and that includes
      an annular connection including a part connected to the substrate and
      a recess that is recessed from the annular connection, wherein:
   the cap is configured such that at least a part of the connection is connected to the substrate to arrange a space communicating with the through hole with the recess facing one of an open end of the one surface of the substrate and an open end of the opposite surface of the one surface of the substrate of the through hole, the cap being sealed integrally with the electronic component by the sealing resin;
   a terminal is inserted into the through hole and electrically connected to the wiring;
   the cap is mounted at a surface, at which the electronic component is mounted, of the substrate; and
   at least the connection of the cap is made of metal for the cap to be mounted at the substrate through a conductive connection member.

2. The electronic device according to claim 1,
wherein the sealing resin covers an entire surface, at which the electronic component is mounted, of the substrate.

3. The electronic device according to claim 1,
wherein the circuit board is a double-sided mounting board at which a back circuit element is mounted at a reverse side of the surface, at which the electronic component is mounted, of the substrate.

4. An electronic structure comprising:
the electronic device according to claim 1;
the terminal; and
a housing member that arranges a housing space to house the electronic device and houses the electronic device in the housing space,
wherein the housing member includes:
a first member, which is made of metal, includes a part facing a surface at which the cap is mounted of the substrate, and is in contact with the electronic device; and
a second member, which is joined to the first member to arrange the housing space, includes a part facing a surface, at which the cap is not mounted, of the substrate, and has the terminal protruded into the housing space.

5. The electronic structure according to claim 4, wherein:
the cap is mounted at a reverse side of a surface, at which the electronic component is mounted, of the substrate in the electronic device;
the first member is arranged with a protrusion, which is a part in contact with the electronic device and protruded from the periphery of the first member; and
the protrusion is in contact with a part of the reverse side of the electronic device via a member having a heat dissipation property, and a part of the sealing resin covering the cap is in contact with the periphery of the protrusion of the first member.

6. The electronic structure according to claim 4,
wherein the second member is arranged with a heat dissipating member, which is in contact with the electronic device in a part facing the surface, at which the cap is not mounted, of the substrate.

7. An electronic device comprising:
a circuit board including
an insulating substrate,
a wiring arranged at the substrate,
an electronic component mounted at the substrate and electrically connected to the wiring,
at least one through hole which is arranged through the substrate from one surface of the substrate to an opposite surface of the one surface of the substrate, and
a conductive member arranged at a surface of the through hole and electrically connected to the wiring; and the electronic device further comprising:
a sealing resin that seals the electronic component; and
a cap that is mounted at the substrate, and that includes
an annular connection including a part connected to the substrate and
a recess that is recessed from the annular connection, wherein:
the cap is configured such that at least a part of the connection is connected to the substrate to arrange a space communicating with the through hole with the recess facing one of an open end of the one surface of the substrate and an open end of the opposite surface of the one surface of the substrate of the through hole, the cap being sealed integrally with the electronic component by the sealing resin;
wherein the cap includes the recess and a flange as the connection protruded from the recess.

8. The electronic device according to claim 7,
wherein the cap is mounted at a surface, at which the electronic component is mounted, of the substrate.

9. The electronic device according to claim 8,
wherein at least the connection of the cap is made of metal for the cap to be mounted at the substrate through a conductive connection member.

10. The electronic device according to claim 9, wherein:
a plurality of through holes is arranged at the substrate; and
the cap is a one-piece body in which a plurality of recesses are arranged while being partitioned from one another.

11. The electronic device according to claim 7,
wherein the cap is mounted at a reverse side of a surface, at which the electronic component is mounted, of the substrate.

12. The electronic device according to claim 7, wherein:
a plurality of the through holes is arranged at the substrate; and
the cap is arranged individually for each of the plurality of through holes.

13. The electronic device according to claim 7, wherein:
a plurality of through holes is arranged at the substrate; and
the cap is a one-piece body in which a plurality of recesses are arranged while being partitioned from one another.

14. The electronic device according to claim 7, wherein:
a plurality of lands are arranged at intervals in a region, which faces the connection, of the substrate; and
the cap is mounted through the plurality of lands.

15. An electronic device comprising:
a circuit board including
an insulating substrate,
a wiring arranged at the substrate,
an electronic component mounted at the substrate and electrically connected to the wiring,
at least one through hole which is arranged through the substrate from one surface of the substrate to an opposite surface of the one surface of the substrate, and
a conductive member arranged at a surface of the through hole and electrically connected to the wiring; and the electronic device further comprising:
a sealing resin that seals the electronic component; and
a cap that is mounted at the substrate, and that includes
an annular connection including a part connected to the substrate and
a recess that is recessed from the annular connection, wherein:
the cap is configured such that at least a part of the connection is connected to the substrate to arrange a space communicating with the through hole with the recess facing one of an open end of the one surface of the substrate and an open end of the opposite surface of the one surface of the substrate of the through hole, the cap being sealed integrally with the electronic component by the sealing resin;
a plurality of the through holes is arranged at the substrate; and
the cap is arranged individually for each of the plurality of through holes.

16. An electronic device comprising:
a circuit board including
- an insulating substrate,
- a wiring arranged at the substrate,
- an electronic component mounted at the substrate and electrically connected to the wiring,
- at least one through hole which is arranged through the substrate from one surface of the substrate to an opposite surface of the one surface of the substrate, and
- a conductive member arranged at a surface of the through hole and electrically connected to the wiring; and the electronic device further comprising:

a sealing resin that seals the electronic component; and
a cap that is mounted at the substrate, and that includes
- an annular connection including a part connected to the substrate and
- a recess that is recessed from the annular connection, wherein:

the cap is configured such that at least a part of the connection is connected to the substrate to arrange a space communicating with the through hole with the recess facing one of an open end of the one surface of the substrate and an open end of the opposite surface of the one surface of the substrate of the through hole, the cap being sealed integrally with the electronic component by the sealing resin;
a plurality of lands are arranged at intervals in a region, which faces the connection, of the substrate; and
the cap is mounted through the plurality of lands.

17. The electronic device according to claim 16, wherein:
a plurality of through holes is arranged at the substrate; and
the cap is a one-piece body in which a plurality of recesses are arranged while being partitioned from one another.

18. An electronic structure comprising:
an electronic device including:
a circuit board including
- an insulating substrate,
- a wiring arranged at the substrate,
- an electronic component mounted at the substrate and electrically connected to the wiring,
- at least one through hole which is arranged through the substrate from one surface of the substrate to an opposite surface of the one surface of the substrate, and
- a conductive member arranged at a surface of the through hole and electrically connected to the wiring; and the electronic device further including:
a sealing resin that seals the electronic component; and
a cap that is mounted at the substrate, and that includes
- an annular connection including a part connected to the substrate and
- a recess that is recessed from the annular connection,
in which the cap is configured such that at least a part of the connection is connected to the substrate to arrange a space communicating with the through hole with the recess facing one of an open end of the one surface of the substrate and an open end of the opposite surface of the one surface of the substrate of the through hole, the cap being sealed integrally with the electronic component by the sealing resin;
the terminal; and
a housing member that arranges a housing space to house the electronic device and houses the electronic device in the housing space, and that includes
- a first member, which is made of metal, includes a part facing a surface at which the cap is mounted of the substrate, and is in contact with the electronic device; and
- a second member, which is joined to the first member to arrange the housing space, includes a part facing a surface, at which the cap is not mounted, of the substrate, and has the terminal protruded into the housing space.

19. The electronic structure according to claim 18, wherein the cap is mounted at a surface, at which the electronic component is mounted, of the substrate.

20. The electronic structure according to claim 19, wherein the sealing resin covers an entire surface, at which the electronic component is mounted, of the substrate.

21. The electronic structure according to claim 18, wherein the cap is mounted at a reverse side of a surface, at which the electronic component is mounted, of the substrate.

22. The electronic structure according to claim 18, wherein:
a plurality of through holes is arranged at the substrate; and
the cap is a one-piece body in which a plurality of recesses are arranged while being partitioned from one another.

23. The electronic structure according to claim 18, wherein the circuit board is a double-sided mounting board at which a back circuit element is mounted at a reverse side of the surface, at which the electronic component is mounted, of the substrate.

* * * * *